(12) United States Patent
Lee et al.

(10) Patent No.: US 8,334,197 B2
(45) Date of Patent: Dec. 18, 2012

(54) METHOD OF FABRICATING HIGH-K/METAL GATE DEVICE

(75) Inventors: Da-Yuan Lee, Jhubei (TW); Kuang-Yuan Hsu, Fongyuan (TW); Xiong-Fei Yu, Hsinchu (TW); Wei-Yang Lee, Taipei (TW); Matt Yeh, Hsinchun (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 394 days.

(21) Appl. No.: 12/639,630

(22) Filed: Dec. 16, 2009

(65) Prior Publication Data
US 2011/0143529 A1    Jun. 16, 2011

(51) Int. Cl.
*H01L 21/4763* (2006.01)
(52) U.S. Cl. ...................................................... 438/591
(58) Field of Classification Search ................... 438/591
See application file for complete search history.

(56) References Cited

U.S. PATENT DOCUMENTS

| | | | |
|---|---|---|---|
| 6,248,675 B1 * | 6/2001 | Xiang et al. | 438/166 |
| 6,440,868 B1 * | 8/2002 | Besser et al. | 438/721 |
| 7,531,404 B2 | 5/2009 | Pae et al. | |
| 2009/0042405 A1 * | 2/2009 | Doczy et al. | 438/785 |
| 2009/0230479 A1 * | 9/2009 | Hsu et al. | 257/369 |

OTHER PUBLICATIONS

Unpublished Patent Application filed Oct. 7, 2009, U.S. Appl. No. 12/575,280, titled "Methods for a Gate Replacement Process".
Unpublished Patent Application filed Sep. 25, 2009, U.S. Appl. No. 12/567,227. titled "Fabricating High-K/Metal Gate Devices in a Gate Last Process".

* cited by examiner

*Primary Examiner* — Bradley K Smith
(74) *Attorney, Agent, or Firm* — Haynes and Boone, LLP (57) ABSTRACT

The present disclosure provides a method that includes providing a semiconductor substrate; forming a gate structure over the semiconductor substrate, first gate structure including a dummy dielectric and a dummy gate disposed over the dummy dielectric; removing the dummy gate and the dummy dielectric from the gate structure thereby forming a trench; forming a high-k dielectric layer partially filling the trench; forming a barrier layer over the high-k dielectric layer partially filling the trench; forming an capping layer over the barrier layer partially filling the trench; performing an annealing process; removing the capping layer; forming a metal layer over the barrier layer filling in a remainder of the trench; and performing a chemical mechanical polishing (CMP) to remove the various layers outside the trench.

20 Claims, 9 Drawing Sheets

METHOD OF FABRICATING HIGH-K/METAL GATE DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

However, problems arise when integrating a high-k/metal gate feature in a CMOS technology process flow due to various factors such as incompatibility of materials, complex processes, and thermal budgets. For example, an issue for high-k gate dielectric is its lower thermal stability. Accordingly, the high-k gate dielectric quality may degrade during one or more thermal process cycles (e.g., dummy poly thermal, spacer thermal, and source and drain activation) in the CMOS technology process flow.

SUMMARY

One of the broader forms of an embodiment of the invention involves a method for fabricating a semiconductor device. The method includes providing a semiconductor substrate; forming a gate structure over the semiconductor substrate, first gate structure including a dummy dielectric and a dummy gate disposed over the dummy dielectric; removing the dummy gate and the dummy dielectric from the gate structure thereby forming a trench; forming an interfacial layer on the semiconductor substrate; forming a high-k dielectric layer over the interfacial layer partially filling the trench; forming a barrier layer over the high-k dielectric layer partially filling the trench; forming an capping layer over the barrier layer partially filling the trench; performing an annealing process; removing the capping layer; forming a metal layer over the barrier layer filling in a remainder of the trench; and performing a chemical mechanical polishing (CMP) to remove the various layers outside the trench.

Another one of the broader forms of an embodiment of the invention involves a method for fabricating a semiconductor device. The method includes providing a semiconductor substrate; forming a gate structure over the semiconductor substrate, the first gate structure including a dummy dielectric and a dummy gate disposed over the dummy dielectric; removing the dummy dielectric and the dummy gate from the gate structure thereby forming a trench; forming an interfacial layer at a bottom portion of the trench; forming a high-k dielectric layer over the interfacial layer partially filling the trench; forming a barrier layer over the high-k dielectric layer partially filling the trench; forming a conformal capping layer over the barrier layer; thereafter performing an annealing process; removing the capping layer; forming a metal layer over the barrier layer filling in a remainder of the trench; and removing the various layers outside the trench thereby forming a metal gate.

Yet another one of the broader forms of an embodiment of the invention involves a method for fabricating a semiconductor device. The method includes providing a semiconductor substrate; forming a gate structure over the semiconductor substrate, the gate structure including a dummy dielectric and a dummy gate disposed over the dummy dielectric; forming an inter-level dielectric (ILD) over the substrate and the gate structure; performing a first chemical mechanical polishing (CMP) on the ILD to expose the dummy gate; removing the dummy gate and the dummy dielectric from the gate structure thereby forming a trench; forming an interfacial layer at a bottom portion of the trench; forming a high-k dielectric layer over the interfacial layer partially filling the trench; forming a barrier layer over the high-k dielectric layer partially filling the trench; forming a conformal capping layer over the barrier layer; thereafter performing an annealing process; removing the capping layer; forming a metal layer over the barrier layer filling in a remainder of the trench; and performing a second CMP to remove the various layers outside the trench thereby forming a metal gate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" high-k dielectric/metal gate process, however one skilled in the art may recognize applicability to other processes and/or use of other materials.

Figure 1:
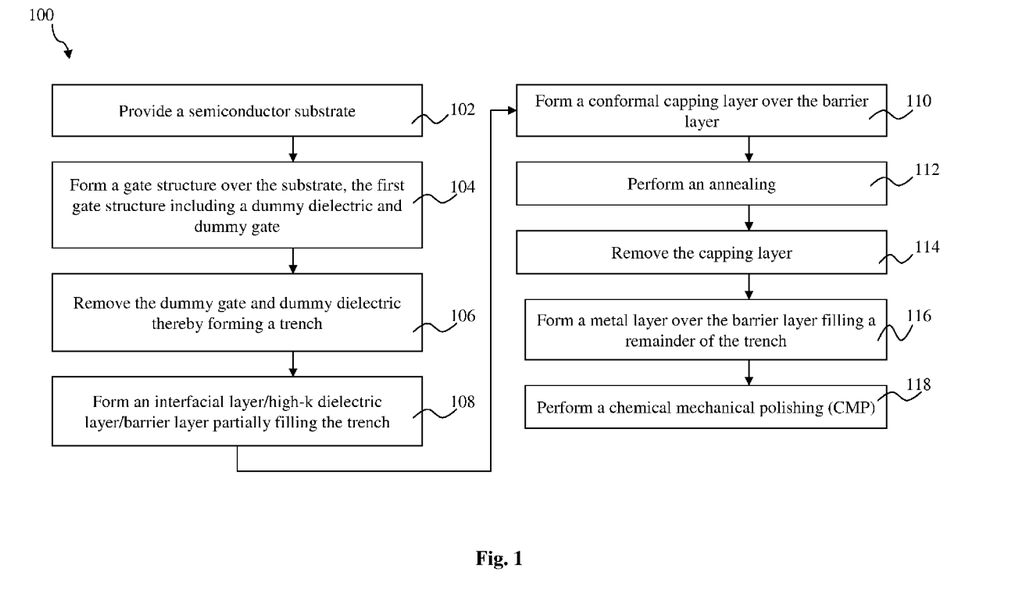
FIG. 1 is a flowchart illustrating a method for fabricating a semiconductor device with a high-k gate dielectric according to various aspects of the present disclosure.

Referring to FIG. 1, illustrated is a flowchart of a method 100 for fabricating a semiconductor device with a high-k metal gate according to various aspects of the present disclosure. The method 100 begins with block 102 in which a semiconductor substrate is provided. The method 100 continues with block 104 in which a gate structure is formed over the substrate, the gate structure including a dummy dielectric and a dummy gate. The method 100 continues with block 106 in which the dummy dielectric and dummy gate are removed from the gate structure thereby forming a trench. The method 100 continues with block 108 in which an interfacial layer, high-k dielectric layer, and barrier layer are formed partially filling the trench.

The method 100 continues with block 110 in which a conformal capping layer is formed over the barrier layer. The method 100 continues with block 112 in which an annealing is performed. The method 100 continues with block 114 in which the capping layer is removed. The method 100 continues with block 116 in which a metal layer is formed over the barrier layer filling the remainder of the trench. The method 100 continues with block 118 in which a chemical mechanical polishing (CMP) is performed. The discussion that follows illustrates various embodiments of a semiconductor device that can be fabricated according to the method 100 of FIG. 1.

Referring also to FIGS. 2A to 2H, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. It is understood that FIGS. 2A to 2H have been simplified for the sake of clarity to better understand the inventive concepts of the present disclosure. The semiconductor device 200 may be fabricated in a high-k dielectric/metal gate last process. In a high-k dielectric/metal gate last process, a dummy dielectric and dummy poly gate structure are initially formed, and is followed a typical CMOS process flow until deposition of an inter-level dielectric (ILD). The dummy dielectric and dummy poly gate structure may then be removed and replaced with a high-k gate dielectric/metal gate structure.

Figure 2A:
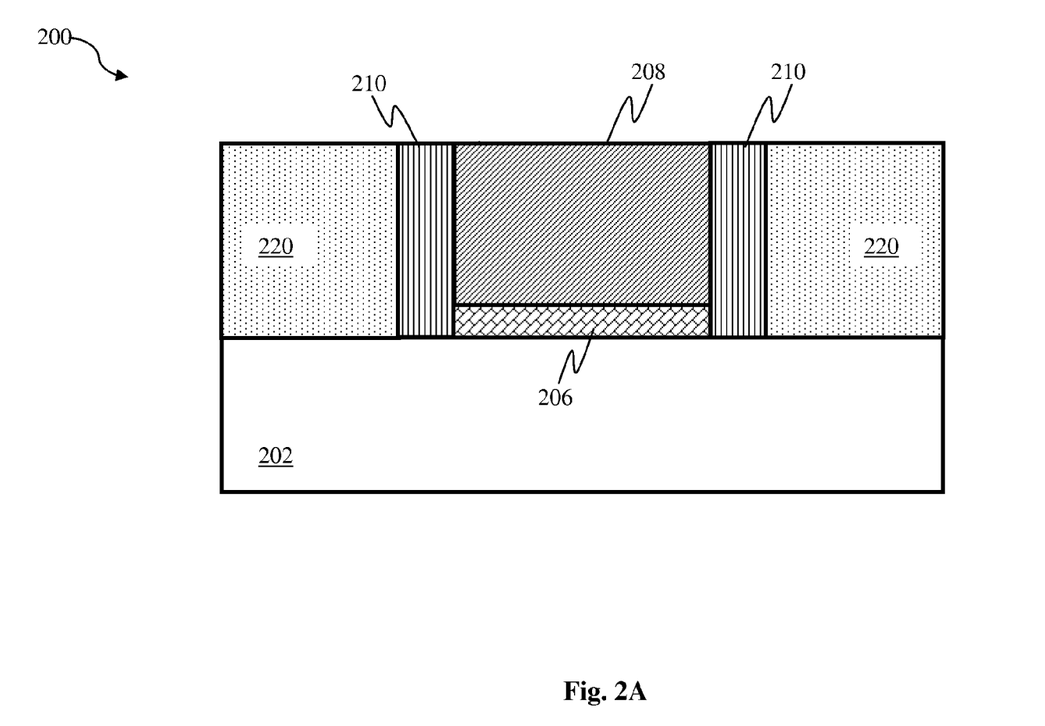
FIGS. 2A to 2H are cross-sectional views of a semiconductor device at various stages of fabrication according to the method of FIG. 1.

In FIG. 2A, the semiconductor 200 is shown following a chemical mechanical polishing (CMP) and etch process performed on the ILD that exposes the dummy poly gate. The semiconductor device 200 includes a semiconductor substrate 202 such as a silicon substrate. The substrate 202 may alternatively include silicon germanium, gallium arsenic, or other suitable semiconductor materials. The substrate 202 may further include doped regions such as a P-well and N-well. The substrate 202 may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 further includes an isolation structure such as a shallow trench isolation (STI) feature formed in the substrate 202 for isolating active regions and of the substrate. Alternatively, the isolation structure may optionally include a local oxidation of silicon (LOCOS) configuration. The isolation structure may be formed of silicon oxide, silicon nitride, silicon oxynitride, fluoride-doped silicate (FSG), and/or a low k dielectric material known in the art.

The active regions may be configured for n-type metal-oxide-semiconductor field effect transistors (e.g., NMOSFET or NFET) and p-type metal-oxide-semiconductor field effect transistors (e.g., PMOSFET or PFET). Although only one gate structure is illustrated, it is understood that the semiconductor device 200 may include a number of gate structures for NFETs and PFETs including short channel and long channel transistors.

The formation of the gate structure includes forming various material layers, and etching/patterning the various material layers to form a gate structure of the PFET device or a gate structure of the NFET device.

In the present embodiment, the semiconductor device 200 includes a dummy dielectric layer 206 formed on the substrate 202. The dummy dielectric layer 206 may include an oxide (e.g., thermal or chemical oxide formation). The dummy dielectric layer 206 may include a thickness ranging from 10 to about 50 Angstrom (A). The semiconductor device 200 may further include a dummy polysilicon (or poly) layer 208 formed over the dummy dielectric layer 206 by a suitable deposition process. In other embodiments, a dummy amorphous silicon layer may be formed over the dummy dielectric layer 206. For example, silane ($SiH_4$), di-silane ($Si_2H_6$), or di-clorsilane ($SiCl_2H_4$) may be used as a chemical gas in a chemical vapor deposition (CVD) process to form the dummy poly layer 208. The dummy poly layer 208 may include a thickness ranging from about 200 to about 2000 Angstrom (A).

The semiconductor device 200 may further include a hard mask layer (not shown) formed on the dummy poly layer 208. The hard mask layer may include silicon nitride, silicon oxynitride, silicon carbide, and/or other suitable dielectric materials, and may be formed using a method such as CVD or physical vapor deposition (PVD or sputtering). The hard mask layer may include a thickness ranging from about 100 to about 400 Angstrom (A). Additionally, an antireflective coating layer or bottom antireflective coating (BARC) layer may be used to enhance a photolithography process for patterning a photoresist layer. For example, a patterned photoresist layer (not shown) may be formed on the hard mask layer including a gate pattern. The gate pattern may be used to pattern the hard mask layer by a dry etch or wet etch process. The patterned hard mask may be used to form a gate structure by a dry etch, wet etch, or combination dry and wet etch process. Accordingly, the gate structure may include a dummy dielectric 206, a dummy poly gate 208, and a hard mask.

After formation of the gate structure (e.g., gate etching or patterning), the semiconductor device 200 may undergo additional CMOS processing to form various features of the NFET and PFET devices as is known in the art. As such, the various features are only briefly discussed herein. The various features may include, lightly doped source/drain regions (n-type and p-type LDD), sidewall or gate spacers 210, source/drain (S/D) regions, silicide features, contact etch stop layer (CESL), and an interlayer dielectric (ILD) 220. It should be noted that strained structures such as silicon germanium (SiGe) and silicon carbide (SiC) features may be formed in the PFET and NFET devices, respectively, to boost and enhance the performance of the devices.

The ILD 220 may include an oxide formed by a high aspect ratio process (HARP) and/or high density plasma (HDP) deposition process. The deposition of the ILD 220 fills in the gaps between adjacent gate structures. Thereafter, a chemical mechanical polishing (CMP) and etch process may be performed on the ILD 220 to planarize the ILD until the dummy poly gate 208 is exposed.

Figure 2B:
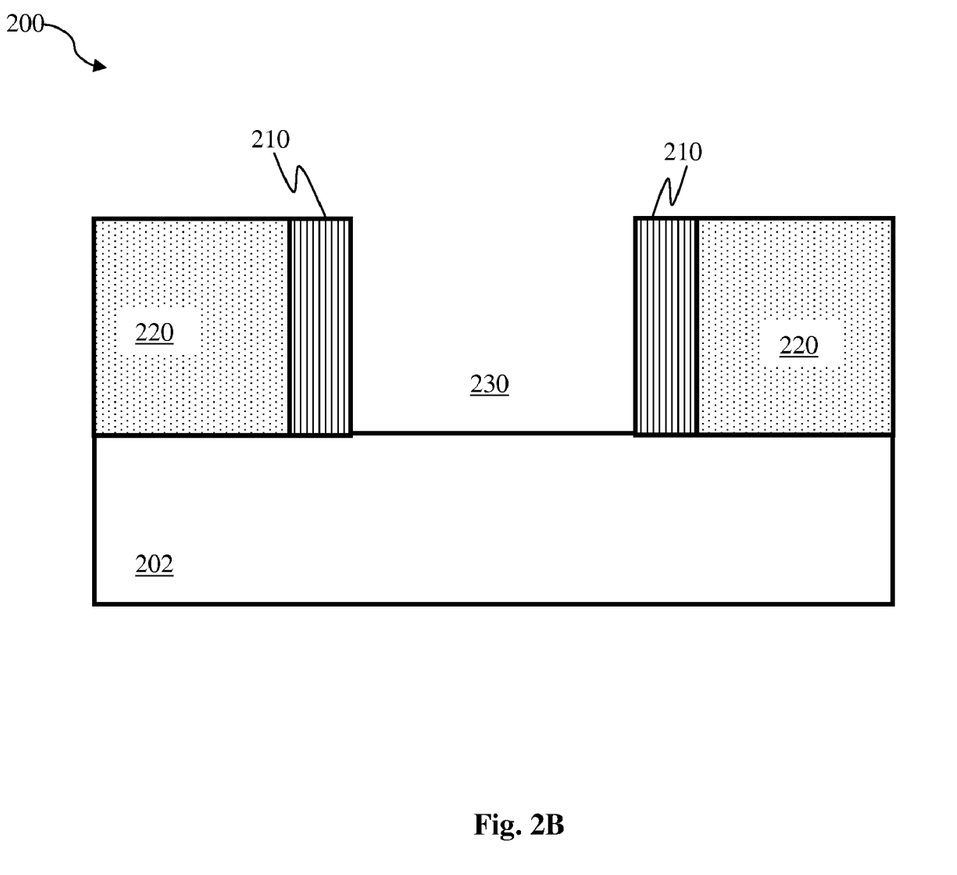

In FIG. 2B, the dummy poly gate 208 and dummy dielectric 206 in the gate structure are removed by a dry etch, wet etch, combination dry and wet etch, or other suitable process. The dummy gate 208 and dummy dielectrics 206 may be removed in a single-step etching process or multiple-step etching process. For example, a first wet etch process may be used to remove the dummy poly gate 208. The first wet etch process may include exposure to a hydroxide containing solution (e.g., ammonium hydroxide), deionized water, and/or other suitable etchant solutions. A second wet etch process may used to remove the dummy dielectric 206. The second wet etch process may include exposure to a buffered HF solution or a buffered oxide etchant (BOE). The second wet etch process may selectively remove the dummy dielectric 206 and may stop at the substrate 202, thereby forming a trench 230 in the gate structure. It is understood that other etching chemicals may be used for selectively removing the dummy dielectric and dummy poly gate.

Figure 2C:
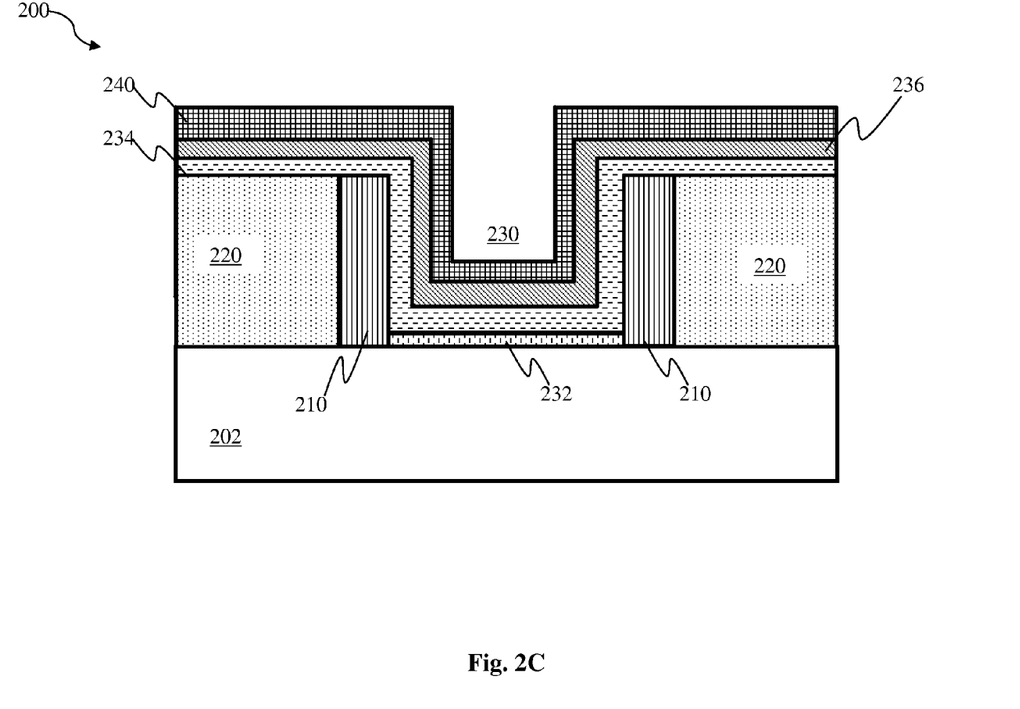

In FIG. 2C, an interfacial layer 232, high-k dielectric layer 234, and barrier layer 236 are formed to partially fill in the trench 230. The interfacial layer 232 may include a silicon oxide ($SiO_2$) layer (e.g., thermal or chemical oxide formation) having a thickness ranging from about 3 to about 20 Angstrom (A). Alternatively, the interfacial layer 232 may optionally include HfSiO or SiON formed by atomic layer deposition (ALD), CVD, PVD, thermal oxidation and nitridation, plasma oxidation and nitridation, or combinations thereof. In some embodiments, an Hf film may be formed on a thermal oxide by ALD, CVD, or PVD, and then oxidized by thermal $O_2$ to form HfSiO. In other embodiments, an Hf film may be formed by ALD, CVD, or PVD in a reactive $O_2$ and $H_2O$ ambient.

The high-k dielectric layer 234 may be formed on the interfacial layer 232. The high-k dielectric layer 234 may be formed by ALD, CVD, metalorganic CVD (MOCVD), PVD, plasma enhanced CVD (PECVD), plasma enhance ALD (PEALD), thermal oxidation, combinations thereof, or other suitable technique. The high-k dielectric layer 234 may include a thickness ranging from about 5 to about 20 Angstrom (Å). The high-k dielectric layer 234 may include a binary or ternary high-k film such as HfOx. Alternatively, the high-k dielectric layer 216 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

The barrier layer 236 may be formed over the high-k dielectric layer 234. The barrier layer 234 may include TiN or TaN having a thickness ranging from about 5 to about 20 Angstrom (A). The barrier layer 236 may function as a barrier to protect the high-k dielectric layer 234. The barrier layer 236 may be formed by various deposition techniques such as ALD, PVD, CVD, PECVD, or other suitable technique.

A capping layer 240 is formed over the barrier layer 236. The capping layer 240 functions to prevent growth of interfacial layer 232 and degradation of the high-k dielectric layer 234 and barrier layer 236 during a subsequent annealing process as will discussed later below. Also, there may be thermal requirements after the high-k dielectric layer formation to maintain lower gate leakage current. For example, the capping layer 240 may include an amorphous silicon layer. Utilizing amorphous silicon allows for deposition at a low temperature less than about 530° C. In contrast, polysilicon is typically formed at temperatures greater than 590° C. The low temperature deposition allows for better control to minimize oxygen diffusion into the barrier layer 236, high-k dielectric layer 234, and interfacial layer 232 prior to capping. Additionally, low pressure and/or oxygen-free ambient are other factors to retard oxygen diffusion during the period from high-k formation to capping formation. The amorphous silicon layer may be formed by PVD, CVD, ALD, and PECVD. In other embodiments, the capping layer 240 may optionally be formed of a low temperature silicon nitride layer formed by ALD, CVD, and PECVD. In some other embodiments, the capping layer 240 may optionally be formed of a low temperature spin-on dielectric (e.g., spin-on glass), polymer, and low melting point ceramic. Further, the material of the capping layer 240 is chosen so that there is a high etching selectivity between the capping layer 240 and barrier layer 236 for better control in subsequent processing when removing the capping layer.

It has been observed that for advanced technology nodes such as 32 nm, 22 nm and beyond, the gate length may be less than 28 nm and in some instances less than 22 nm, and the high-k dielectric layer may be less than 20 Angstrom (A). Accordingly, an aperture of the trench 230 is approximately the size the gate length. Thus, it is important that the capping layer 240 have a thickness less than 100 Angstrom, and in some instances less than 90 Angstrom (A). This thickness of the capping layer 240 will prevent gate seal or completely filling the trench 230. Accordingly, the capping layer 240 is conformally formed on the barrier layer 236. For example, doped low temperature deposition of amorphous silicon can easily form a conformal capping layer. This allows for better etch uniformity when removing the capping layer 240 as will be discussed later below. If the gate (e.g., short channel device) was sealed by the capping layer (e.g., non-conformal capping layer), there would be a large capping layer etch loading effect as compared to another gate (e.g., long channel device) that was not sealed by the capping layer. Accordingly, it would be more difficult to remove the capping layer in the short channel device as compared to the capping layer in the long channel device. By employing a conformal capping layer in all the gates of short channel and long channel devices, it would be easier to remove the capping layer since etch uniformity is better.

Figure 2D:
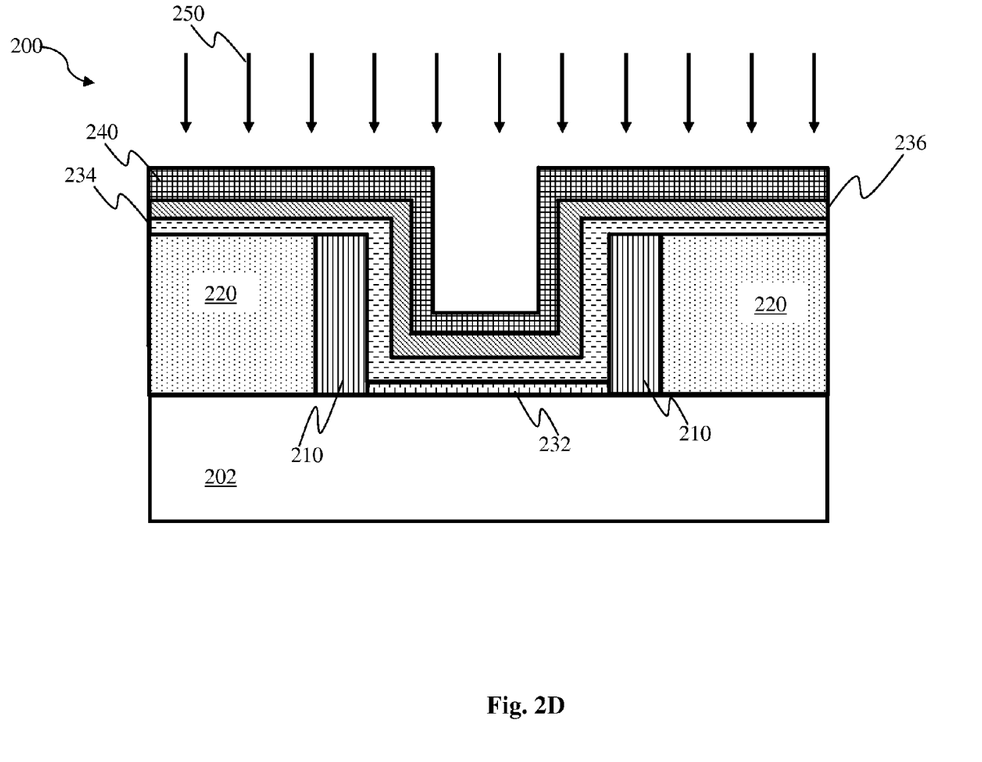

In FIG. 2D, an annealing process 250 is performed on the semiconductor device 200. The annealing process 250 includes a rapid thermal process (RTP) such as rapid thermal annealing (RTA) for less than a second. The RTA is performed at a temperature ranging from about 700° C. to about 1000° C. In other embodiments, the annealing process 250 may optionally include a flash annealing or a laser annealing for a period in milliseconds. The annealing process 250 repairs defects and improves the interfaces of the barrier layer 236, high-k dielectric layer 234, and interfacial layer 232 which can improve device performance. As noted above, the capping layer 240 prevents growth of interfacial layer 232 and degradation of the high-k dielectric layer 234 and barrier layer 236 during the annealing process 250.

Figure 2E:
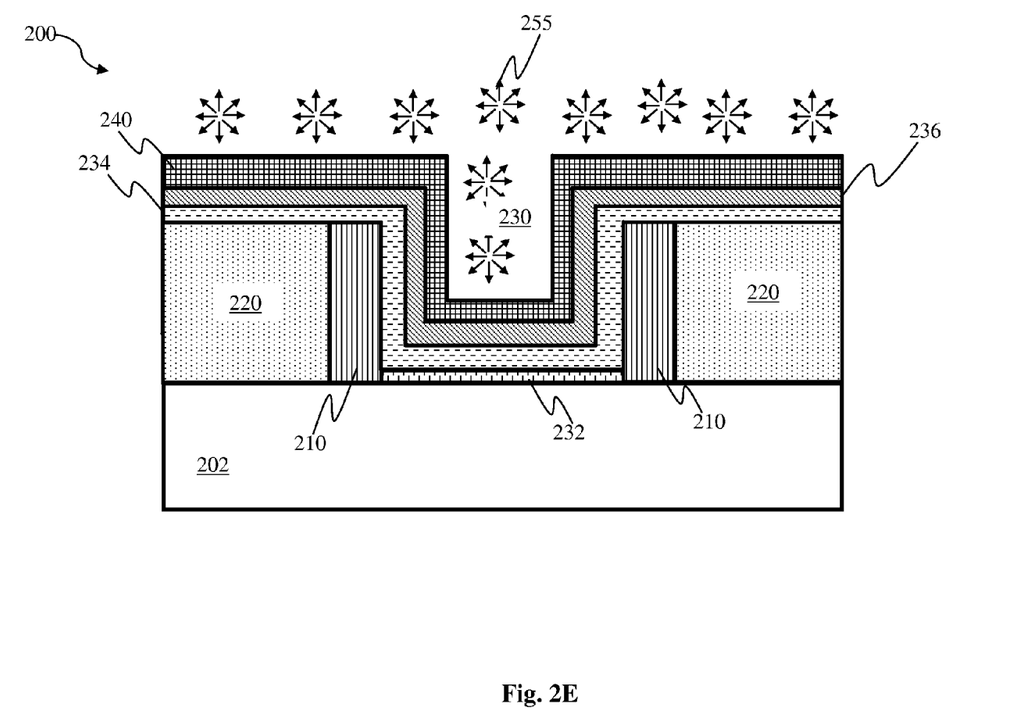
Figure 2F:
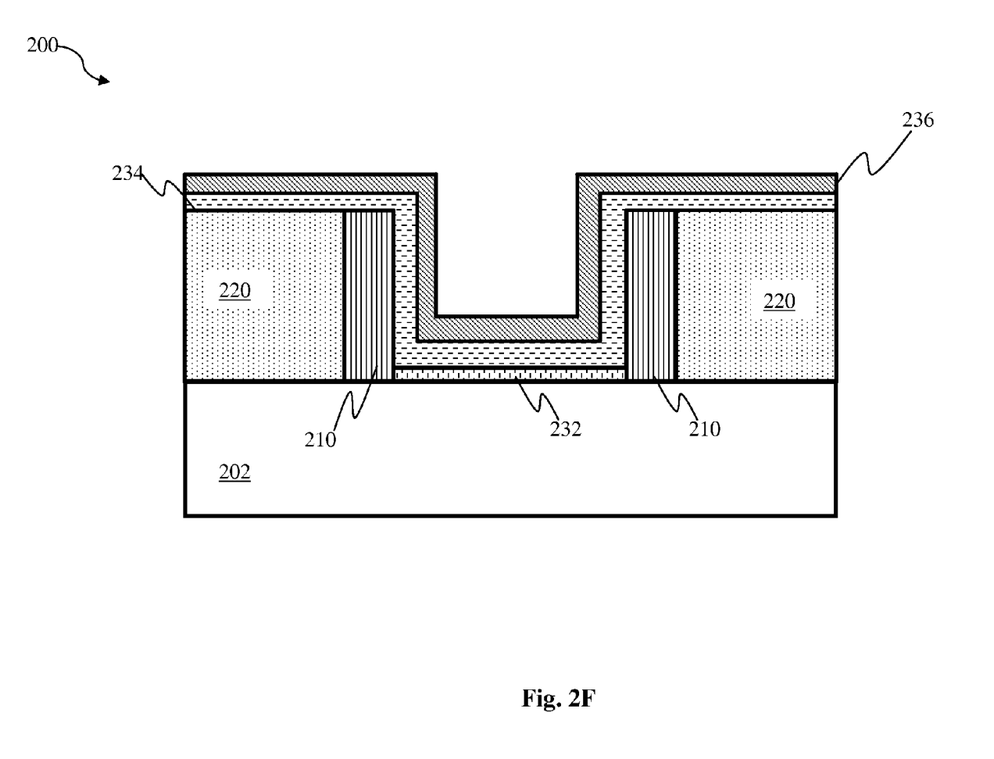

In FIG. 2E, an etching process 255 is performed to remove the capping layer 240 after the annealing process. The etching process 255 may include a wet etching or dry etching. For example, a wet etching may utilize an etchant such as a hydroxide containing solution (e.g., ammonium hydroxide), and/or other suitable etchant solutions known in the art. Since the capping layer 240 is conformal, the etchant can easily reach regions within the trench 230, and thus etch uniformity is improved (as compared to a non-conformal capping layer that seals the gate). As noted above, the barrier layer 236 functions as an etch stop layer due to the high etching selectivity between the capping layer 240 and the barrier layer 236. In other embodiments, a dry etching may utilize known gas combinations suitable for removing the capping layer 240. An optional cleaning process may be performed after the etching process 255. FIG. 2F, shows the semiconductor device 200 after removal of the capping layer 240.

Figure 2G:
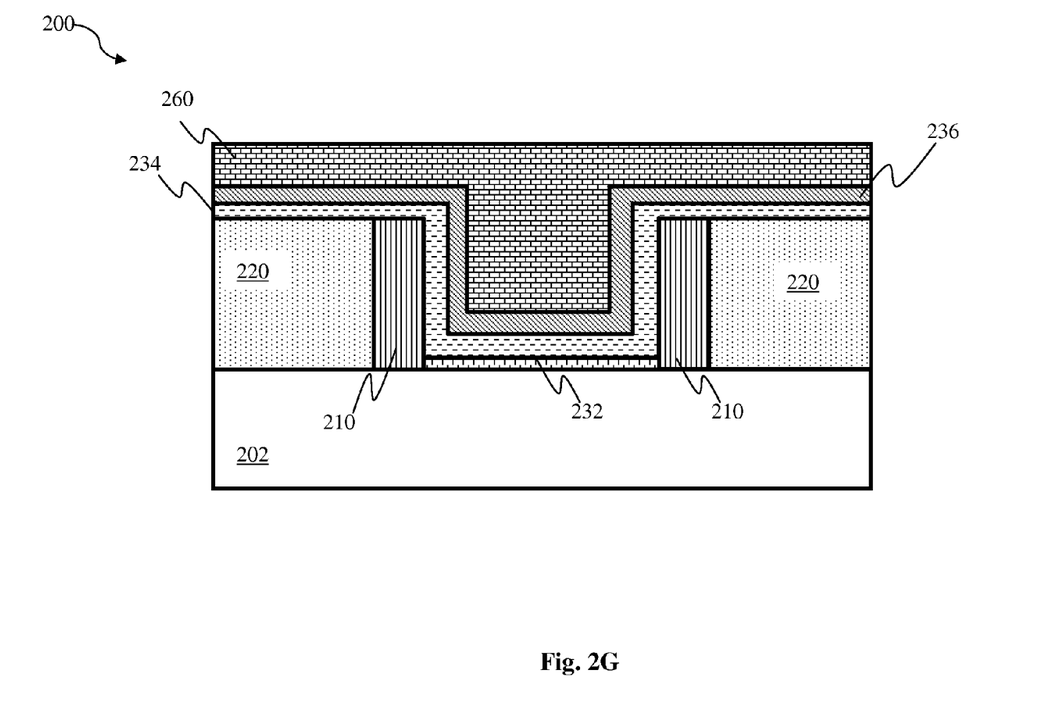

In FIG. 2G, a metal layer 260 may be formed to fill in a remainder of the trench 230. The metal layer 260 may include any metal material suitable for forming a metal gate or portion thereof, including work function layers, liner layers, interface layers, seed layers, adhesion layers, barrier layers, etc. For example, a P-type work function metal (P-metal) may be formed over the barrier layer 236. The P-metal layer may be formed by ALD, PVD, CVD, or other suitable process. Alternatively, the P-metal layer may optionally include other suitable metals, such as WN, TaN, or Ru, that properly perform in the PFET device. Further, the P-metal layer may also include a multi-metal layer structure such as TiN/WN.

In other embodiments, an N-type work function metal (N-metal) may be formed over the barrier layer 236. The N-metal may include a layer of TiAl. The N-metal layer may be formed by ALD, PVD, CVD, or other suitable process. Alternatively, the N-metal layer may optionally include other suitable metals, such as Ti, Ag, Al, TiAlN, TaC, TaCN, TaSiN, Mn, or Zr that properly perform in the NFET device. Further, a fill metal may be deposited over the work function metal layer. For example, a layer of titanium (Ti) may be deposited to function as a wetting layer for a subsequent aluminum (Al) fill. The Ti layer may be formed by PVD or other suitable process. A layer of Al may be formed on the Ti layer to fill in the remainder of the trench 230. The Al layer may be formed by forming a first Al layer by CVD and then forming a second Al layer by PVD. Alternatively, the fill metal may optionally include tungsten (W), copper (Cu), or other suitable metal material.

Figure 2H:
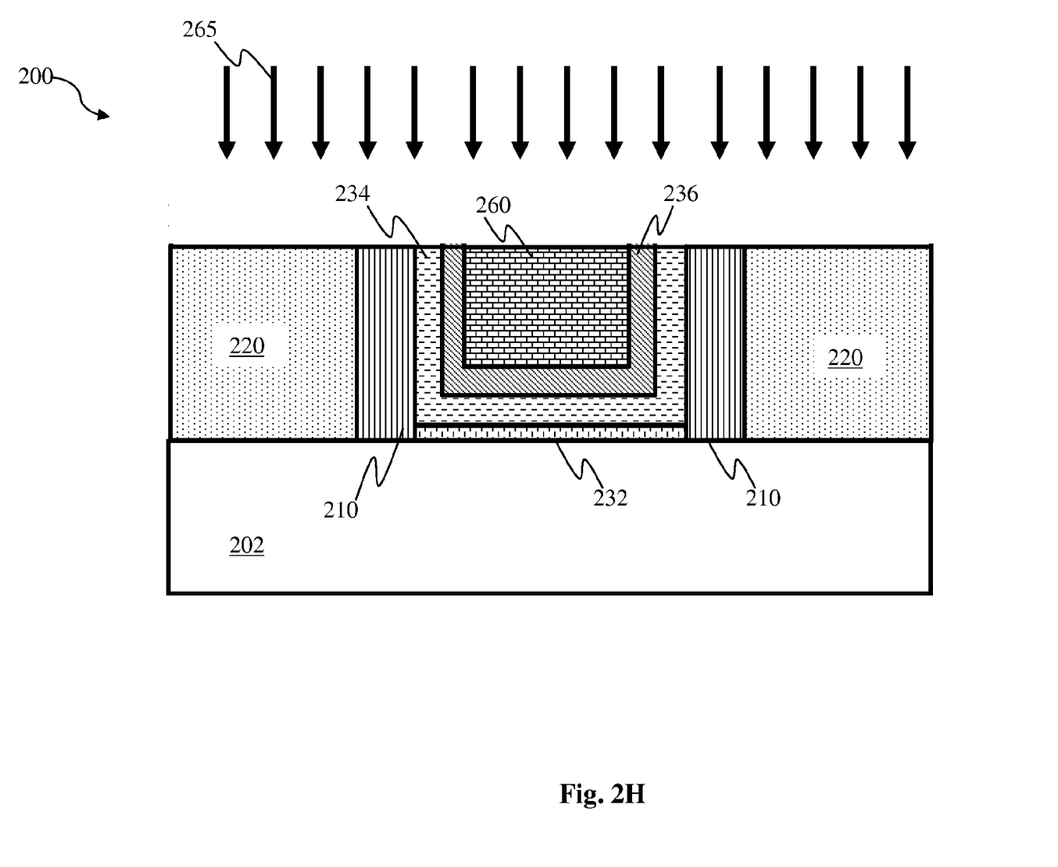

In FIG. 2H, a CMP 265 may be performed on the semiconductor device 200 to remove the various layers (high-k dielectric layer 234, barrier layer 236, and metal layer 260) outside the trench 230. The CMP 265 may have a high selectivity to provide a substantially planar surface for the gate structure and ILD layer 220. Accordingly, the metal gate may perform the proper P work function or N work function. Thus, the desired threshold voltages of the PFET and NFET devices may be achieved without added complexity. Further, the quality and integrity of the interfacial layer 232, high-k dielectric layer 234, and barrier layer 236 are maintained since these layers experience a lower thermal cycle in a high-k/metal gate last process. It is understood that the semiconductor device 200 may undergo further processing to form various features such as contacts/vias, interconnect metal layers, passivation layers, etc.

The present invention achieves different advantages in various embodiments disclosed herein. It is understood that different embodiments disclosed herein offer several different advantages, and that no particular advantage is necessarily required for all embodiments. For example, the present disclosed method provides a simple and cost-effective method for forming high-k gate dielectric and metal gate in a gate last process using a dummy dielectric and dummy poly gate. Thus, the high-k gate dielectric quality in the final device is improved since the high-k dielectric experiences less thermal processes (e.g., less thermal cycles on the high-k dielectric). Additionally, the methods and devices disclosed herein utilize a conformal capping layer that is formed by a low temperature deposition process which can improve the quality of the interfacial layer, high-k dielectric layer, and barrier layer during an annealing process and improve the etching process to remove the capping layer after the annealing process as was discussed above. This becomes very important with smaller features in advanced technology nodes such as 32 nm, 22 nm, and beyond.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a semiconductor substrate;
   forming a gate structure over the semiconductor substrate, first gate structure including a dummy dielectric and a dummy gate disposed over the dummy dielectric;
   removing the dummy gate and the dummy dielectric from the gate structure thereby forming a trench;
   forming an interfacial layer on the semiconductor substrate;
   forming a high-k dielectric layer over the interfacial layer partially filling the trench;
   forming a barrier layer over the high-k dielectric layer partially filling the trench;
   forming a capping layer over the barrier layer partially filling the trench;
   performing an annealing process;
   removing the capping layer after performing the annealing process;
   forming a metal layer over the barrier layer filling in a remainder of the trench after removing the capping layer; and
   performing a chemical mechanical polishing (CMP) to remove the various layers outside the trench.

2. The method of claim 1, wherein the capping layer has a thickness of no more than 100 Angstrom.

3. The method of claim 2, wherein the gate structure has a gate length of no more than about 28 nm.

4. The method of claim 1, wherein the capping layer is formed in a temperature environment less than about 530° C.

5. The method of claim 4, wherein the capping layer includes one of an amorphous silicon layer, a silicon nitride layer, and a spin-on dielectric layer.

6. The method of claim 1, wherein the capping layer is conformally formed over the barrier layer.

7. The method of claim 1, wherein the metal layer includes one of a p-type work function metal layer and an n-type work function metal layer.

8. The method of claim 1, wherein the annealing process is performed at a temperature ranging from about 700° C. to about 1000° C.

9. A method of fabricating a semiconductor device, comprising:
   providing a semiconductor substrate;
   forming a gate structure over the semiconductor substrate, the first gate structure including a dummy dielectric and a dummy gate disposed over the dummy dielectric;
   removing the dummy dielectric and the dummy gate from the gate structure thereby forming a trench;
   forming an interfacial layer at a bottom portion of the trench;

forming a high-k dielectric layer over the interfacial layer partially filling the trench;

forming a barrier layer over the high-k dielectric layer partially filling the trench;

forming a conformal capping layer over the barrier layer; thereafter performing an annealing process;

removing the capping layer, wherein removing the conformal capping layer includes completely removing the conformal capping layer;

forming a metal layer over the barrier layer filling in a remainder of the trench; and removing the various layers outside the trench thereby forming a metal gate.

10. The method of claim 9, wherein the annealing process is performed at a temperature ranging from about 700° C. to about 1000° C.

11. The method of claim 9, wherein the capping layer has a thickness less than 100 Angstrom.

12. The method of claim 9, wherein the capping layer is formed at a temperature less than about 530° C.

13. The method of claim 9, wherein the metal layer includes a p-type work function metal layer and the semiconductor device includes a p-type MOSFET.

14. The method of claim 9, wherein the metal layer includes an n-type work function metal layer and the semiconductor device includes an n-type MOSFET.

15. The method of claim 9, wherein the capping layer includes one of an amorphous silicon layer, a silicon nitride layer, and a spin-on dielectric layer.

16. A method of fabricating a semiconductor device, comprising:

providing a semiconductor substrate;

forming a gate structure over the semiconductor substrate, the gate structure including a dummy dielectric and a dummy gate disposed over the dummy dielectric;

forming an inter-level dielectric (ILD) over the substrate and the gate structure;

performing a first chemical mechanical polishing (CMP) on the ILD to expose the dummy gate;

removing the dummy gate and the dummy dielectric from the gate structure thereby forming a trench;

forming an interfacial layer at a bottom portion of the trench;

forming a high-k dielectric layer over the interfacial layer partially filling the trench;

forming a barrier layer over the high-k dielectric layer partially filling the trench;

forming a conformal capping layer over the barrier layer; thereafter performing an annealing process;

removing the capping layer after performing the annealing process, wherein removing the capping layer includes completely removing the capping layer, forming a metal layer over the barrier layer filling in a remainder of the trench; and performing a second CMP to remove the various layers outside the trench thereby forming a metal gate.

17. The method of claim 16, wherein the capping layer is formed at a temperature less than about 530° C. and in a substantially oxygen-free environment.

18. The method of claim 16, wherein the trench has an aperture less than about 28 nm.

19. The method of claim 18, wherein the capping layer has a thickness less than about 100 Angstrom.

20. The method of claim 16, wherein the capping layer includes one of an amorphous silicon layer and a silicon nitride layer.

* * * * *